United States Patent
Horio et al.

(10) Patent No.: US 6,979,995 B2
(45) Date of Patent: Dec. 27, 2005

(54) FREQUENCY MEASURING CIRCUIT AND RESONANT PRESSURE SENSOR TYPE DIFFERENTIAL PRESSURE/PRESSURE TRANSMITTER USING THE FREQUENCY MEASURING UNIT

(75) Inventors: Yasuaki Horio, Musashino (JP); Masaaki Nikkuni, Musashino (JP); Masahiko Moriya, Musashino (JP); Hiroki Yoshino, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 117 days.

(21) Appl. No.: 10/654,974

(22) Filed: Sep. 5, 2003

(65) Prior Publication Data
US 2004/0075425 A1  Apr. 22, 2004

(30) Foreign Application Priority Data
Oct. 22, 2002 (JP) ............................. 2002-306482
Feb. 20, 2003 (JP) ............................. 2003-042462

(51) Int. Cl.[7] ........................ G01R 23/14; G06M 1/10
(52) U.S. Cl. ............................. 324/76.48; 324/76.41
(58) Field of Search ................... 324/76.48, 76.41; 327/31, 39, 47, 48; 377/20, 28; 702/75, 78

(56) References Cited

U.S. PATENT DOCUMENTS

| 4,005,364 A | * | 1/1977 | Harrington | ............... 324/76.59 |
| 4,764,694 A | | 8/1988 | Winroth | ..................... 307/602 |
| 5,097,490 A | | 3/1992 | Hulsing, II et al. | ........... 377/28 |
| 5,333,162 A | | 7/1994 | Condreva | ..................... 377/20 |
| 6,029,524 A | * | 2/2000 | Klauder et al. | ............... 73/718 |
| 6,233,529 B1 | * | 5/2001 | Nonaka | ....................... 702/76 |

FOREIGN PATENT DOCUMENTS

| EP | 0 456 029 | 11/1991 |
| EP | 0 505 324 | 9/1992 |
| JP | 01-124773 | 5/1989 |
| JP | 5-157647 | 6/1993 |
| JP | 7-71979 | 3/1995 |
| JP | 6-274240 | 9/2004 |

* cited by examiner

*Primary Examiner*—Anjan Deb
*Assistant Examiner*—John Teresinski
(74) *Attorney, Agent, or Firm*—Westerman, Hattori, Daniels & Adrian, LLP

(57) ABSTRACT

A time difference signal having a pulse width corresponding to the time difference between an output of a resonant pressure sensor and a reference clock is prepared. The pulse width of the time difference signal is expanded by a given magnification. Based on a count value obtained by counting the reference clock during the expanded pulse width and a count value obtained by counting the reference clock during one cycle of the output of the resonant pressure sensor or a period which is integer times as long as the one cycle, the output frequency of the resonant pressure sensor is obtained. It is possible to obtain the fast processing and the high resolution without increasing the frequency of the reference clock.

14 Claims, 6 Drawing Sheets

FREQUENCY MEASURING CIRCUIT AND RESONANT PRESSURE SENSOR TYPE DIFFERENTIAL PRESSURE/PRESSURE TRANSMITTER USING THE FREQUENCY MEASURING UNIT

BACKGROUND OF THE INVENTION

1. Field of the Invention

The present invention relates to a frequency measuring circuit which can measure the frequency of a signal to be measured at a high speed and with high resolution without speeding up a reference clock and a resonant pressure sensor type differential pressure/pressure transmitter using the frequency measuring circuit.

2. Description of the Related Art

FIG. 1 shows the constitution of a frequency measuring circuit used in a two-wire resonant pressure sensor type differential pressure/pressure transmitter. A resonant pressure sensor 6 outputs a signal f having frequency corresponding to a measured pressure. The signal f is inputted to a D-type flip flop 7 and is converted into a signal F which is in synchronism with a rise of a reference clock. The signal F and the reference clock are inputted to a counter 8. The counter 8 counts the reference clocks during one cycle of the signal F or a period integer times as long as the cycle so as to measure the frequency of the signal F. The frequency data are inputted to a micro computer 9 which computes the differential pressure or the pressure.

FIG. 2 shows a timing chart of the D-type flip flop 7. The reference clock is a pulse signal having a fixed frequency. The signal f is a signal having a frequency considerably lower than the frequency of the reference clock and is not in synchronism with the reference clock. The D-type flip flop 7 samples the signal f at a rise of the reference clock. Accordingly, the output F of the D-type flip flop 7 is changed in synchronism with a rise of the reference clock.

That is, the D-type flip flop 7 generates the signal F which is in synchronism with the reference clock in response to the signal f which is not in synchronism with the reference clock. Here, a gate time shown in FIG. 2 indicates a unit period in which the counter 8 counts the signal F and the reference clock.

However, the resonant pressure sensor-type differential pressure/pressure transmitter having such a constitution has a following drawback.

In the constitution shown in FIG. 1, the counter 8 is served for counting the reference clock and hence, the counter 8 cannot obtain the resolution of equal to or less than 1 cycle of the reference clock. To obtain the frequency of the output f of the resonant pressure sensor 6 at a high speed, it is necessary to shorten the gate time shown in FIG. 2. However, when the gate time is shortened, there has been a drawback that the resolution of the count value is lowered.

Although it is necessary to elevate the frequency of the reference clock to increase the resolution, this elevation of the frequency brings about the increase of power consumption. Since the two-wire differential pressure/pressure transmitter is required to exhibit the small power consumption, there has been also a drawback that the increase of the frequency of the reference clock is difficult.

Accordingly, it is an object of the present invention to provide a frequency measuring circuit which can obtain high-speed processing without elevating the frequency of a reference clock and prevents lowering of resolution and a resonant pressure sensor type differential pressure/pressure transmitter using the frequency measuring circuit.

SUMMARY OF THE INVENTION

To achieve the above-mentioned object, according to a first aspect of the present invention, there is provided a frequency measuring circuit which comprises: a first counter which counts reference clocks during one cycle of a signal to be measured or a period which is integer times as long as the one cycle, a time difference detection circuit which detects time difference between the signal to be measured and the reference clock, a time expansion circuit which expands an output pulse width of the time difference detection circuit by a given magnification, and a second counter which counts the reference clocks during the pulse width which is expanded by the time difference expansion circuit, wherein the frequency of the signal to be measured is obtained based on count values of the first and second counters. Due to such a constitution, the fast processing and the high resolution of measurement can be achieved without increasing the frequency of the reference clock.

According to a second aspect of the present invention, in the frequency measuring circuit according to the first aspect of the present invention, the count value of the second counter is divided by the given magnification with which the time expansion circuit expands the pulse width, and a result of the division is added to the count value of the first counter so as to obtain the frequency of the signal to be measured. Due to such a constitution, the frequency can be easily obtained.

According to a third aspect of the present invention, in the frequency measuring circuit according to the first or second aspect of the present invention, the time difference detection circuit outputs a pulse signal having the pulse width from a point of time that a level of the signal to be measured is changed to a point of time that a level of the reference clock is changed. Due to such a constitution, the time difference signal can be easily obtained.

According to a fourth aspect of the present invention, in the frequency measuring circuit according to any one of the first to third aspects of the present invention, the time expansion circuit includes a first time constant circuit which is charged with a given voltage, a second time constant circuit which has a time constant larger than a time constant of the first time constant circuit and is charged with a given voltage, a comparator which compares output voltages of the first and second time constant circuits, and a gate circuit to which an output of the comparator and a signal relevant to a start signal are inputted and outputs a signal relevant to an output of the comparator during a pulse width of the signal relevant to the start signal, wherein a charge stored in the first time constant circuit during the output pulse width of the time difference detection circuit is discharged, and a charge stored in the second time constant circuit during the pulse width of the start signal is discharged. Due to such a constitution, the pulse width can be easily expanded.

According to a fifth aspect of the present invention, in the frequency measuring circuit according to any one of the first to third aspects of the present invention, the time expansion circuit includes a first voltage dividing circuit and a second voltage dividing circuit which are arranged between a fixed power source voltage and a common potential point, an operational amplifier which connects a voltage dividing point of the first voltage dividing circuit with an inverted input terminal and connects a voltage dividing point of the second voltage dividing circuit to a non-inverted input terminal as a fixed threshold voltage thus forming an integrator, and a comparator which connects an output of the operational amplifier with an inverted input terminal and connects a voltage dividing point of the second voltage dividing circuit to a non-inverted input terminal as a fixed threshold voltage, wherein a charge stored in a capacitor in the inside of the integrator is discharged in response to inputting of the time difference signal.

According to a sixth aspect of the present invention, there is provided a resonant pressure sensor type differential pressure/pressure transmitter which comprises: a first counter which counts reference clocks during one cycle of a resonant pressure sensor or a period which is integer times as long as the one cycle, a time difference detection circuit which detects time difference between the signal to be measured and the reference clock, a time expansion circuit which expands an output pulse width of the time difference detection circuit by a given magnification, and a second counter which counts the reference clocks during the pulse width which is expanded by the time expansion circuit, wherein the frequency of the signal to be measured is obtained based on count values of the first and second counters, and pressure is obtained based on the frequency. Due to such a constitution, the fast processing and the high resolution of measurement can be achieved without increasing the frequency of the reference clock.

According to a seventh aspect of the present invention, in the resonant pressure sensor type differential pressure/pressure transmitter according to the sixth aspect of the invention, the count value of the second counter is divided by the given magnification with which the time expansion circuit expands the pulse width, and a result of the division is added to the count value of the first counter so as to obtain the frequency of the signal to be measured. Due to such a constitution, the frequency can be obtained easily.

According to an eighth aspect of the present invention, in the resonant pressure sensor type differential pressure/pressure transmitter according to the sixth or seventh aspect of the present invention, the time difference detection circuit outputs a pulse signal having the pulse width from a point of time that a level of the signal to be measured is changed to a point of time that a level of the reference clock is changed. Due to such a constitution, the time difference signal can be easily obtained.

According to a ninth aspect of the present invention, in the resonant pressure sensor type differential pressure/pressure transmitter according to any one of the sixth to eighth aspects of the present invention, the time expansion circuit includes a first time constant circuit which is charged with a given voltage, a second time constant circuit which has a time constant larger than a time constant of the first time constant circuit and is charged with a given voltage, a comparator which compares output voltages of the first and second time constant circuits, and a gate circuit to which an output of the comparator and a signal relevant to a start signal are inputted and outputs a signal relevant to an output of the comparator during a pulse width of the signal relevant to the start signal, wherein a charge stored in the first time constant circuit during the output pulse width of the time difference detection circuit is discharged, and a charge stored in the second time constant circuit during the pulse width of the start signal is discharged. Due to such a constitution, the pulse width can be easily expanded.

According to a tenth aspect of the present invention, in the resonant pressure sensor type differential pressure/pressure transmitter according to any one of the sixth to eighth aspects of the present invention, the time expansion circuit includes a first voltage dividing circuit and a second voltage dividing circuit which are arranged between a fixed power source voltage and a common potential point, an operational amplifier which connects a voltage dividing point of the first voltage dividing circuit with an inverted input terminal and connects a voltage dividing point of the second voltage dividing circuit to a non-inverted input terminal as a fixed threshold voltage thus forming an integrator, and a comparator which connects an output of the operational amplifier with an inverted input terminal and connects a voltage dividing point of the second voltage dividing circuit to a non-inverted input terminal as a fixed threshold voltage, wherein a charge stored in a capacitor in the inside of the integrator is discharged in response to inputting of the time difference signal.

DESCRIPTION OF THE PREFERRED EMBODIMENTS

Preferred embodiments of the present invention are explained in detail hereinafter in conjunction with attached drawings.

Figure 1:
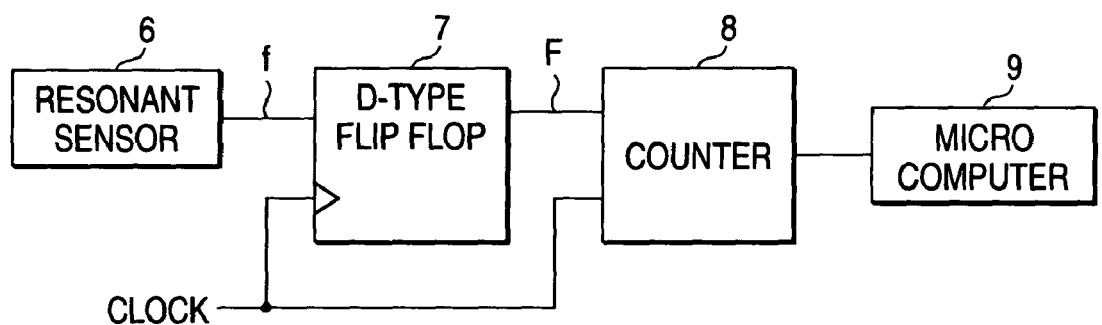
FIG. 1 is a constitutional view of a conventional resonant pressure sensor type differential pressure/pressure transmitter.
Figure 2:
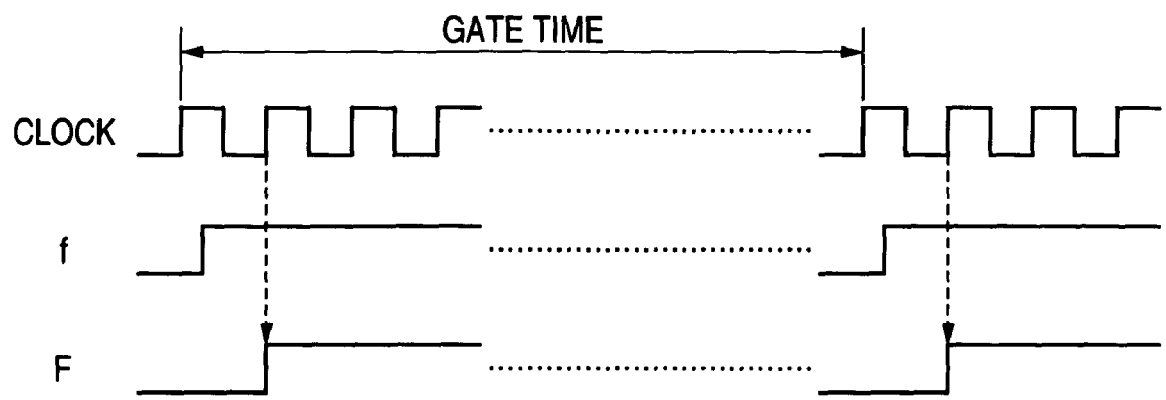
FIG. 2 is a waveform chart for explaining the manner of operation of a D-type flip flop.
Figure 3:
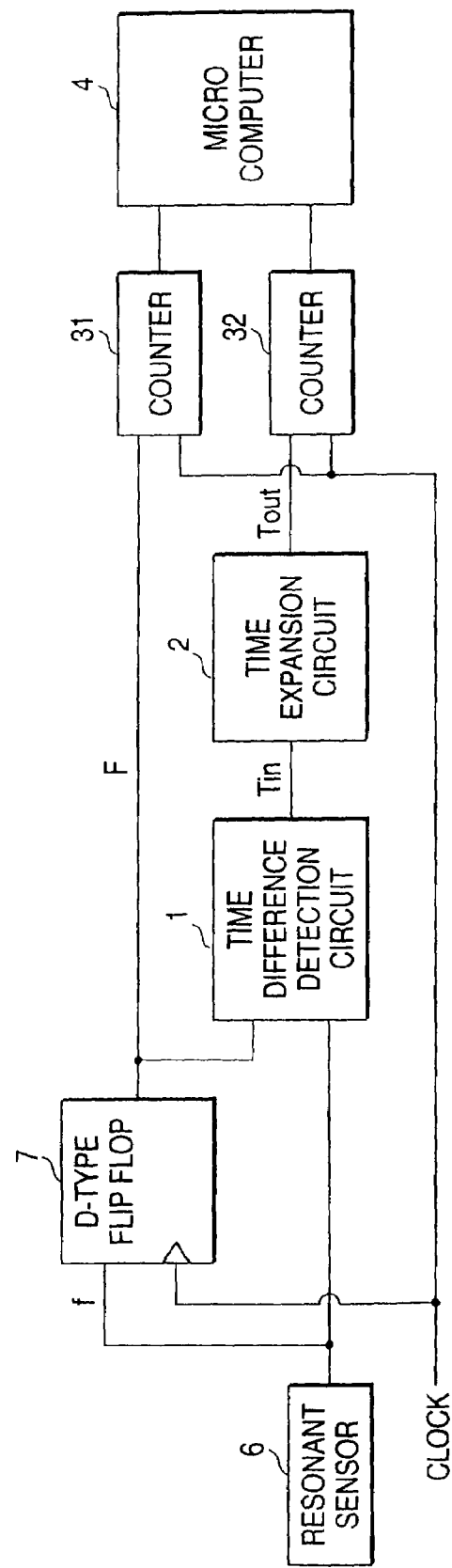
FIG. 3 is a constitutional view of one embodiment of the present invention.

FIG. 3 is a constitutional view showing one embodiment of a frequency measuring circuit used in a differential pressure/pressure transmitter according to the present invention. Here, components which are identical with the components shown in FIG. 1 are indicated by same numerals and their explanation is omitted.

In FIG. 3, numeral 1 indicates a time difference detection circuit to which an output f of a resonant pressure sensor 6 and an output F of a D-type flip flop 7 are inputted. The time difference detection circuit 1 outputs a signal Tin which assumes a low level at a rise of the output f and assumes a high level at a rise of the output F which follows the output f. That is, the output Tin of the time difference detection circuit 1 is a signal which has a pulse width of time difference between the outputs f and F.

Numeral 2 indicates a time expansion circuit to which the output Tin of the time difference detection circuit 1 is inputted. The time expansion circuit outputs a signal Tout having a pulse width which is obtained by expanding the pulse width of the output Tin, that is, the low level period, by a given magnification. Numeral 31 indicates a counter which counts reference clocks during one cycle of the output F or during a period which is integer times as long as the one cycle. That is, the counter 31 performs the same operation as that of the counter 8 of the conventional example shown in FIG. 6.

Numeral 32 indicates a counter to which the output Tout of the time expansion circuit 2 and the reference clock are inputted. The counter 32 counts the reference clock during the pulse width of the output Tout, that is, during a period in which the output Tout assumes a low level. Numeral 4 indicates a micro computer to which count values of the counters 31, 32 are inputted. The micro computer 4 divides the count value of the counter 32 by magnification with which the time expansion circuit 2 expands the pulse width of the input signal and computes a frequency of the output f of the resonant pressure sensor 6 by adding a result of the division to the count value of the counter 31. A pressure value is also computed base on the frequency.

Figure 4:
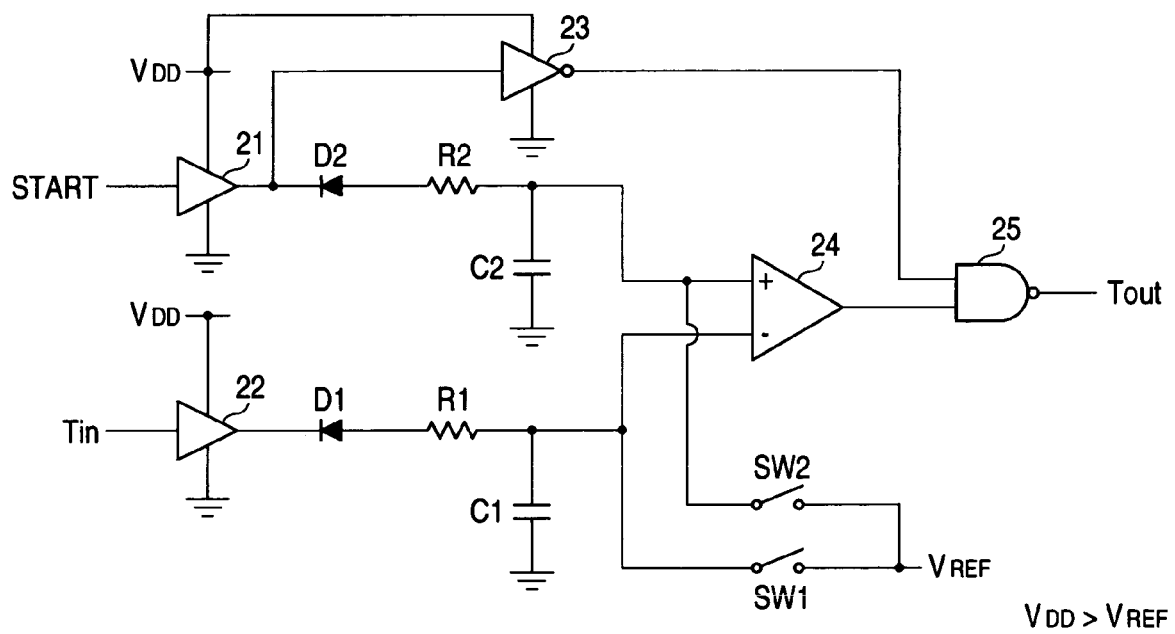
FIG. 4 is a constitutional view showing one embodiment of a time expansion circuit.

FIG. 4 is a constitutional view of one embodiment of the time expansion circuit 2. In FIG. 4, numeral 24 indicates a comparator, wherein a resistance R2 and a capacitor C2 are connected to a non-inverted input terminal and a resistance R1 and a capacitor C1 are connected to an inverted input terminal. Another ends of the capacitors C1, C2 are connected to a common potential point. Further, to another ends of the resistances R1, R2, anodes of diodes D1, D2 are respectively connected. A first time constant circuit is constituted of the capacitor C1 and the resistance R1 and a second time constant circuit is constituted of the capacitor C2 and the resistance R2.

Numeral 21 indicates a buffer to which a START signal is inputted. An output terminal of the buffer 21 is connected to a cathode of the diode D2. Numeral 22 indicates a buffer to which the output Tin of the time difference detection circuit 1 is inputted and a cathode of the diode D1 is connected to an output terminal of the buffer 22. The diode D1, D2 are inserted to prevent the inflow of an electric current to the capacitors C1, C2 from the buffers 21, 22.

Numeral 23 indicates an inverter to which an output of the buffer 21 is inputted. Numeral 25 indicates a NAND gate for two inputs, wherein an output of the inverter 23 and an output of the comparator 24 are inputted. An output of the NAND gate 25 constitutes the output Tout of the time expansion circuit 2.

SW1, SW2 indicate switches, wherein one ends of the switches SW1, SW2 are connected to a reference voltage VREF, another end of the switch SW1 is connected to the inverted input terminal of the comparator 24, and another end of the switch SW2 is connected to the same non-inverted input terminal. A voltage value of the reference voltage VREF is set to a value which is lower than a power source voltage VDD of the buffers 21, 22 and the inverter 23.

Figure 5:
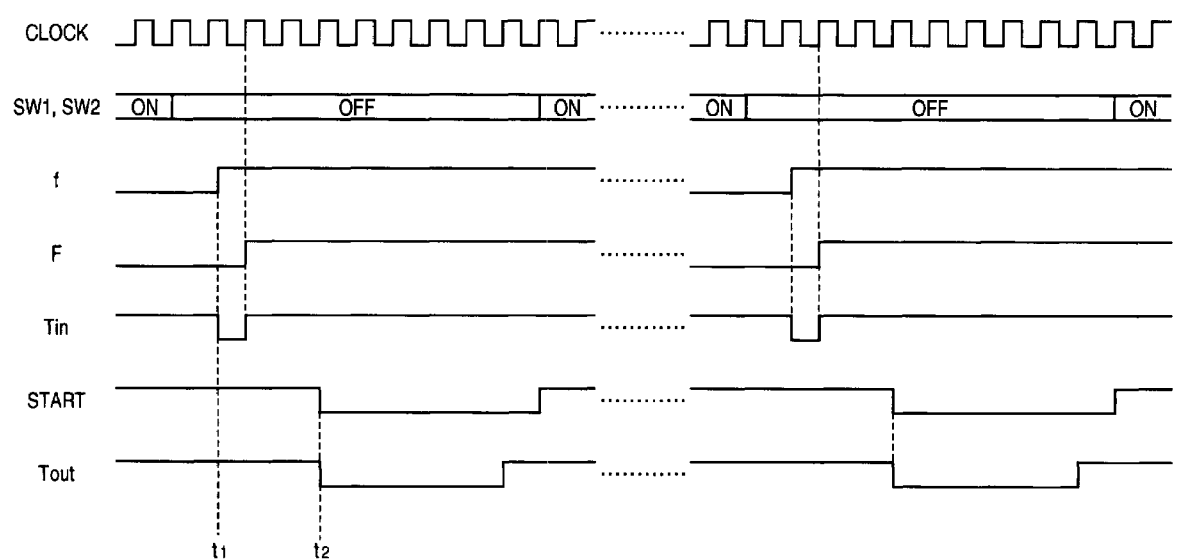
FIG. 5 is a waveform chart of one embodiment of the present invention.

Next, the manner of operation of this embodiment is explained in conjunction with a waveform chart shown in FIG. 5. In FIG. 5, waveforms of the reference clock, ON/OFF states of the switches SW1, SW2, the output f of the resonant pressure sensor 6, the output F of the D-type flip flop 7, the output Tin of the time difference detection circuit 1, the START signal and the output Tout of the time expansion circuit 2 are respectively shown in the descending order from above.

When the switches SW1, SW2 are turned on, the capacitors C1, C2 are charged with the reference voltage VREF. When the charging is completed, the switches SW1, SW2 are turned off. Here, the START signal assumes the high level. This START signal is inverted by the inverter and is inputted to the NAND gate 25 and hence, the output Tout of the NAND gate 25 assumes the high level.

When the output f rises at a point of time t1, the output Tin falls. Then, in response to a rise of the next reference clock, the output F rises and, at the same time, the output Tin rises. During the output Tin assumes a low level, the charge which is stored in the capacitor C1 is discharged through the resistance R1. Accordingly, the output of the comparator 24 assumes the high level. A voltage between both ends of the capacitor C1 is lowered by $\Delta V1$ which is expressed by a following formula.

$$\Delta V1 = (VREF - VF) \times [1 - \exp(-Tin/(R1 \times C1))] \quad (1)$$

Here, Tin indicates a period in which the above-mentioned output Tin assumes the low level, while VF indicates a voltage drop value of the diode D1 in the normal direction.

When the output Tin assumes the high level, the START signal is held at the low level for a fixed time at a next point of time t2. Since both of two inputs of the NAND gate 25 assume the high level, the output Tout of the NAND gate 25 is changed to the low level. Further, the charge stored in the capacitor C2 is discharged through the resistance R2 and hence, the voltage between both ends of the capacitor C2 is gradually lowered in accordance with a following equation (2).

$$\Delta V(t) = (VREF - VF) \times [1 - \exp(-t/(R2 \times C2))] \quad (2)$$

Here, VF indicates a voltage drop value of the diode D2 in the normal direction and t indicates time which lapses after the START signal assumes the low level.

When the voltage between both ends of the capacitor C2 becomes lower than the voltage between both ends of the capacitor C1, the output of the comparator 24 is inverted to the low level. Accordingly, the output Tout of the NAND gate 25 is inverted to the high level.

To express the capacitances of the capacitors C1, C2 using the same symbols C1, C2 and the resistance values of the resistances R1, R2 using the same symbols R1, R2, a time constant of the first time constant circuit which is constituted of the capacitor C1 and the resistance R1 becomes C1×R1, while a time constant of the second time constant circuit which is constituted of the capacitor C2 and the resistance R2 becomes C2×R2.

The voltage between both ends of the capacitor C1 is decreased at a rate of 1/(C1×R1), while the voltage between both ends of the capacitor C2 is decreased at a rate of 1/(C2×R2). Accordingly, the pulse width of the output Tout of the time expansion circuit 2 is expanded by (C2×R2)/(C1×R1) times of the output Tin of the time difference detection circuit 1.

To be more specific, assuming the pulse width of the output Tout as Tout, by setting the $\Delta V$(Tout) in the formula (1) and the $\Delta V$(Tout) in the formula (2) equal to each other, Tout=Tin×(C2×R2)/(C1×R1) is obtained.

Here, the constitutional view in FIG. 4 shows one embodiment of the time expansion circuit and it is not always necessary to adopt this constitution. That is, any constitution which can expand the pulse width of the input signal by a fixed magnification can be used.

Figure 6:
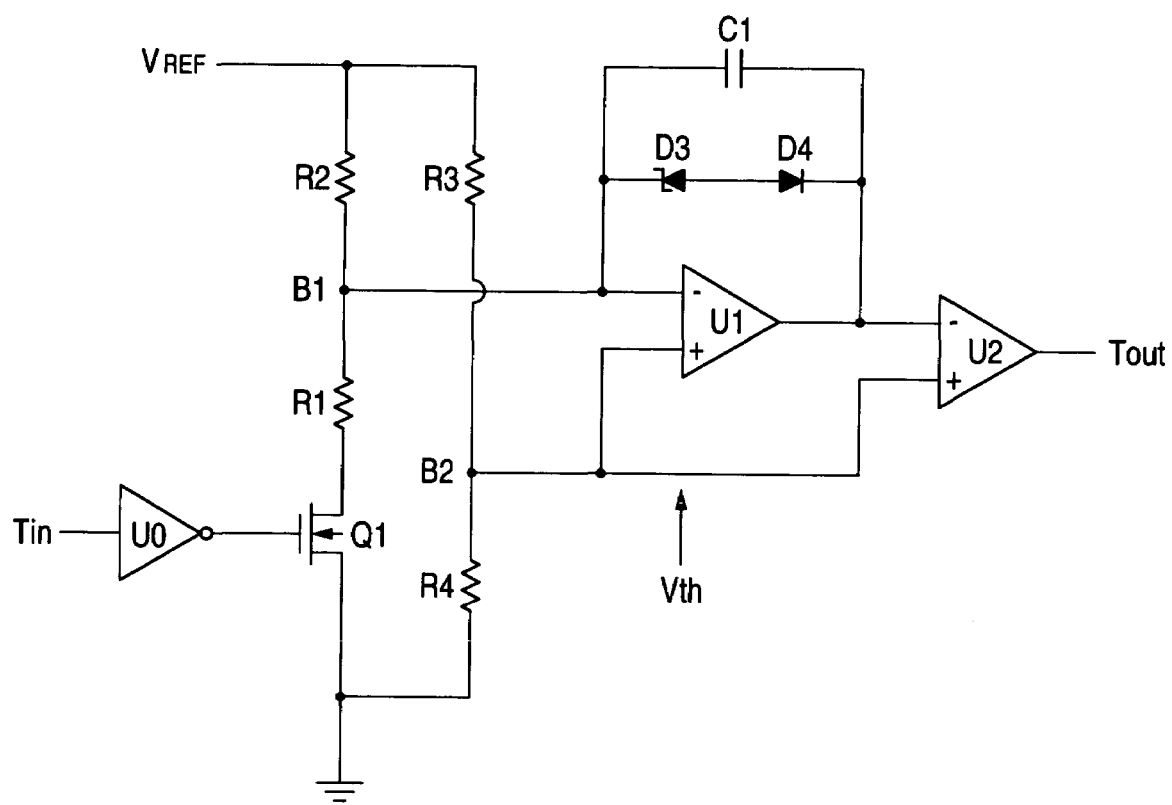
FIG. 6 is a constitutional view showing another embodiment of a time expansion circuit.

The constitutional view in FIG. 6 shows another embodiment of the time expansion circuit 2. In the drawing, the time differential signal Tin opens or closes an N channel FET switch Q1 through an inverter U0. When the time differential signal Tin is at the high level, the N channel FET switch Q1 is controlled to assume an OFF state, while when the time differential signal Tin is at the low level, the N channel FET switch Q1 is controlled to assume an ON state. VREF is a fixed power source voltage applied between the N channel FET switch Q1 and a common potential point.

A first voltage dividing circuit which is constituted of a series circuit of resistances R2 and R1 and a second voltage dividing circuit which is constituted of a series circuit of resistances R3 and R4 are connected between the power source voltage VREF and the common potential point, and an FET switch Q1 is inserted in series with the resistance R1 of the first voltage dividing circuit. A voltage dividing point B1 of the first voltage dividing circuit is connected to an inverted input terminal of an operational amplifier U1 which constitutes an integrator, while a potential of a voltage dividing point B2 of the second voltage dividing circuit is supplied, as a fixed threshold voltage Vth, to a non-inverted input terminal of the operational amplifier U1 and a non-inverted input terminal of a comparator amplifier U2 which constitutes a comparator.

A capacitor C1 is connected between the inverted input terminal and the output terminal of the operational amplifier U1 which constitutes the integrator, while the output terminal of the operational amplifier U1 is connected to the non-inverted input terminal of the comparator amplifier U2. A series circuit which is constituted of a fixed voltage diodes D3 and a fixed voltage diode D4 and is connected to the capacitor C1 in parallel regulates a negative-side potential of an output voltage of the operational amplifier U1.

In such a constitution, when the FET switch Q1 assumes the OFF state, the capacitor C1 is charged with the power source voltage VREF through the resistance R2 and hence, the output voltage of the operational amplifier U1 is set to a given low level which is lower than the threshold voltage Vth regulated by the fixed voltage diodes D3, D4. Here, the comparator amplifier U2 which constitutes the comparator is set to the high level.

When the FET switch Q1 assumes the ON state as the time difference signal Tin assumes the low level, the potential of the voltage dividing point B1 is set to a value lower than the threshold voltage Vth and hence, the charge of the capacitor C1 is discharged and the output voltage of the operational amplifier U1 is elevated at a fixed gradient determined by a time constant based on the resistances R1, R2 and the capacitor C1. When this elevated voltage exceeds the threshold voltage Vth, the output of the comparator U2 is inverted to the low level from the high level.

Further, when the input of the time difference signal Tin assumes the high level, the capacitor C1 which constitutes the integrator is charged by the power source voltage VREF through the resistance R2 and hence, the output voltage of the operational amplifier U1 is lowered at a gradient determined by the time constant based on the capacitor C1 and the resistance R2, and when this voltage is lowered exceeding the threshold voltage Vth, the output of the comparator amplifier U2 is inverted to the high level from the low level. The inversion time to the lower level side of the comparator amplifier U2 is used as the expansion time Tout.

Figure 7:
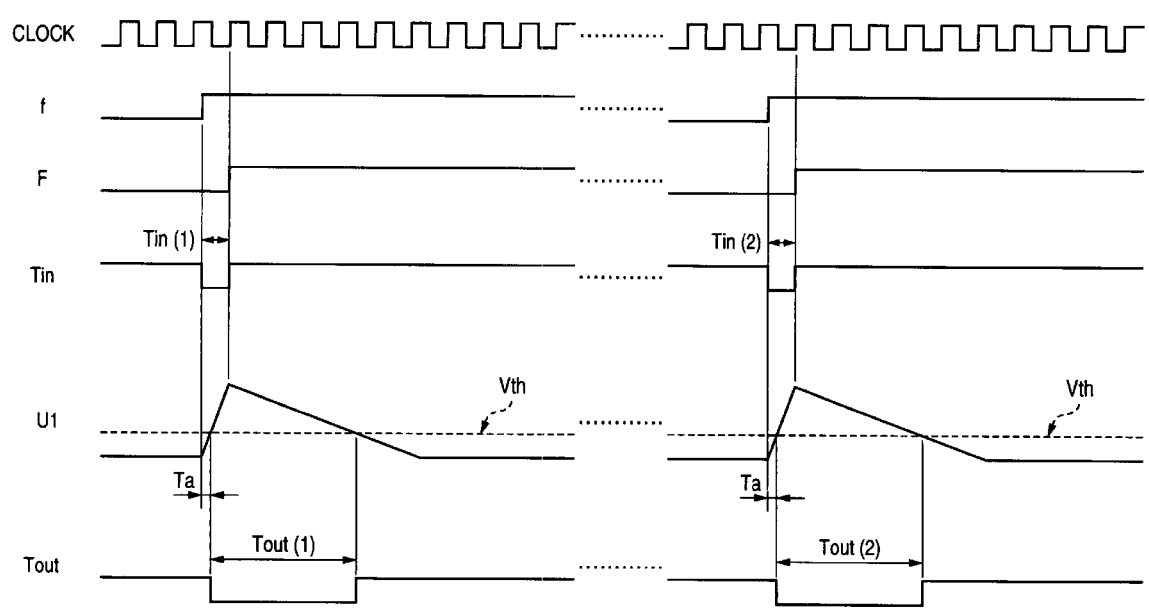
FIG. 7 is a waveform chart of another embodiment of the present invention.

Next, the manner of operation of this embodiment is explained based on the waveform chart shown in FIG. 7.

In FIG. 7, waveforms of the reference clock, the output f of the resonant pressure sensor 6, the output F of the D-type flip flop 7, the output Tin of the time difference detection circuit 1, the output of the operational amplifier U1, and the output of the comparator amplifier U2, that is, the time Tout which is obtained by expanding the output Tin of the time difference detection circuit 1 are respectively shown in the descending order from above.

Here, the output of the time difference detection circuit which is generated at the start of the gate time is indicated by Tin(1) and the time difference which is generated at the end of the gate time is indicated by Tin(2). Further, the expanded time which is generated at the start of the gate time is indicated by Tout(1) and the expanded time which is generated at the end of the gate time is indicated by Tout(2). Time Ta indicates time from the start of the time difference Tin to a point of time that the output of the comparator amplifier 2 is inverted to the low level from the high level.

Next, the steps of signal processing is explained. With the use of the time expansion circuit shown in FIG. 6, the expanded times are respectively determined as follows.

$$Tout(1) = (R2 \times R4)/(R1 \times R3) \times \{Tin(1) - Ta\}$$

$$Tout(2) = (R2 \times R4)/(R1 \times R3) \times \{Tin(2) - Ta\}$$

Here, the actually necessary information is the difference between Tin and Tout and this difference can be obtained as follows.

$$Tout(2) - Tout(1) = (R2 \times R4)/(R1 \times R3) \times \{Tin(2) - Tin(1)\}$$

Accordingly, an expansion ratio of time width becomes $(R2 \times R4)/(R1 \times R3)$.

In the manner of operation to obtain the expanded time Tout(1) in FIG. 7, the first counter 10 measures the integrated value of the output F and the integrated value is set as Fn. During this expanded time Tout(1), the second counter 13 measures the time width of the Tout(1) and this value is set as $\delta$Tn.

Next, in the manner of operation to obtain the expanded time Tout(2), the first counter 10 measures the integrated value of the output F and the integrated value is set as Fn+1. During this expanded time Tout(2), the second counter 13 measures the time width of the Tout(2) and this value is set as $\delta$tn+1.

Based on the above-mentioned count values Fn, Fn+1, $\delta$Tn and $\delta$Tn+1, the reference clock, the gate time, the resistances R1, R2, R3 and R4, the micro computer 14 performs the correction calculation of the frequency f with increased resolution using a following formula.

$$f = [\{(Fn+1) - Fn\} + \{(\delta Tn+1) - \delta Tn\} \times (R1 \times R3)/(R2 \times R4)]/\text{gate time}$$

In this manner, according to this embodiment, the expansion ratio can be purely determined based on only the resistances R1, R2, R3 and R4 and hence, it is possible to ensure the high accuracy by selecting resistances having low temperature coefficients as the resistances R1, R2, R3 and R4.

Further, although the counter 31 is configured to count the reference clock during one cycle of the output F of the D-type flip flop 7, it is not always necessary to set the counting period to one cycle. The counting period may be a period which is obtained by multiplying a fixed magnification to one cycle such as two cycles or a ½ cycle. Further, the counter 31 and the counter 32 may be configured to count reference clocks which are different from each other.

As can be clearly understood from the foregoing explanation, according to the present invention, following advantageous effects can be obtained.

According to the first aspect of the present invention, the frequency measuring circuit includes the first counter which counts reference clocks during one cycle of a signal to be measured or the period which is integer times as long as the one cycle, the time difference detection circuit which detects time difference between the signal to be measured and the reference clock, the time expansion circuit which expands an output pulse width of the time difference detection circuit by a given magnification, and the second counter which counts the reference clocks during the pulse width which is expanded by the time expansion circuit, wherein the frequency of the signal to be measured is obtained based on count values of the first and second counters.

Due to such a constitution, the present invention can obtain an advantageous effect that the fast processing and the high resolution of measurement can be achieved without increasing the frequency of the reference clock. For example, the measuring time can be shortened to ¼ by shortening the count time of the first counter to ¼ while increasing the pulse width of the time difference signal 4 times using the time expansion circuit. Since the frequency of the reference clock can be decreased, it is also possible to achieve advantageous effects that the power consumption of the circuit can be reduced and inexpensive low-speed parts can be used.

According to the second aspect of the present invention, in the frequency measuring circuit according to the first aspect of the present invention, the count value of the second counter is divided by the given magnification with which the time expansion circuit expands the pulse width, and the result of the division is added to the count value of the first counter so as to obtain the frequency of the signal to be measured. Due to such a constitution, it is possible to achieve an advantageous effect that the frequency can be easily obtained. Particularly, by setting the magnification ratio of the time expansion circuit to the nth power of 2, a shift calculation can be used in place of multiplication and hence, it is also possible to have an advantageous effect that the micro computer can be largely simplified.

According to the third aspect of the present invention, in the frequency measuring circuit according to the first or the second aspect of the present invention, the time difference detection circuit outputs a pulse signal having the pulse width from a point of time that a level of the signal to be measured is changed to a point of time that a level of the reference clock is changed. Due to such a constitution, it is possible to have an advantageous effect that the time difference signal can be easily obtained.

According to the fourth aspect of the present invention, in the frequency measuring circuit according to any one of the first to third aspects of the present invention, the time expansion circuit includes the first time constant circuit which is charged with the given voltage, the second time constant circuit which has a time constant larger than a time constant of the first time constant circuit and is charged with the given voltage, the comparator which compares output voltages of the first and second time constant circuits, and the gate circuit to which the output of the comparator and the signal relevant to the start signal are inputted and outputs the signal relevant to the output of the comparator during the pulse width of the signal relevant to the start signal, wherein the charge stored in the first time constant circuit during the output pulse width of the time difference detection circuit is discharged, and the charge stored in the second time constant circuit during the pulse width of the start signal is discharged.

Due to such a constitution, it is possible to achieve an advantageous effect that the pulse width can be expanded with the simple circuit. Further, it is also possible to achieve an advantageous effect that the expansion ratio can be changed by merely changing values of the capacitor and the resistance.

According to the fifth aspect of the present invention, in the frequency measuring circuit according to any one of the first to third aspects of the present invention, the time expansion circuit includes the first voltage dividing circuit and the second voltage dividing circuit which are arranged between the fixed power source voltage and the common potential point, the operational amplifier which connects the voltage dividing point of the first voltage dividing circuit with the inverted input terminal and connects the voltage dividing point of the second voltage dividing circuit to the non-inverted input terminal as the fixed threshold voltage thus forming the integrator, and the comparator which connects the output of the operational amplifier with the inverted input terminal and connects the voltage dividing point of the second voltage dividing circuit to the non-inverted input terminal as the fixed threshold voltage, wherein the charge stored in the capacitor in the inside of the integrator is discharged in response to inputting of the time difference signal.

Due to such a constitution, it is possible to achieve an advantageous effect that the pulse width can be expanded with the simple circuit. Further, it is also possible to achieve an advantageous effect that the expansion ratio can be changed by merely changing value of the resistance.

According to the sixth aspect of the present invention, the resonant pressure sensor type differential pressure/pressure transmitter includes the first counter which counts reference clocks during one cycle of the resonant pressure sensor or the period which is integer times as long as the one cycle, the time difference detection circuit which detects time difference between the signal to be measured and the reference clock, the time expansion circuit which expands the output pulse width of the time difference detection circuit by the given magnification, and the second counter which counts the reference clocks during the pulse width which is expanded by the time difference expansion circuit, wherein the frequency of the signal to be measured is obtained based on count values of the first and second counters, and pressure is obtained based on the frequency.

Due to such a constitution, the present invention can obtain an advantageous effect that the fast processing and the high resolution of measurement can be achieved without increasing the frequency of the reference clock. For example, the measuring time can be shortened to ¼ by shortening the count time of the first counter to ¼ while increasing the pulse width of the time difference signal 4 times using the time expansion circuit. Since the frequency of the reference clock can be decreased, it is also possible to achieve advantageous effects that the power consumption of the circuit can be reduced and inexpensive low-speed parts can be used. Particularly, when the two-wire type transmitter is used, the strict restriction is imparted on the power consumption and hence, this power consumption reduction effect is remarkable.

According to the seventh aspect of the present invention, in the resonant pressure sensor type differential pressure/pressure transmitter according to the sixth aspect of the invention, the count value of the second counter is divided by the given magnification with which the time expansion circuit expands the pulse width, and the result of the division is added to the count value of the first counter so as to obtain the frequency of the signal to be measured. Due to such a constitution, it is possible to obtain an advantageous effect that the frequency can be easily obtained. Particularly, due to such a constitution, by setting the magnification ratio of the time expansion circuit to the nth power of 2, a shift calculation can be used in place of multiplication and hence, it is also possible to have an advantageous effect that the micro computer can be largely simplified.

According to the eighth aspect of the present invention, in the resonant pressure sensor type differential pressure/pressure transmitter according to the sixth or seventh aspect of the present invention, the time difference detection circuit outputs the pulse signal having the pulse width from the point of time that the level of the signal to be measured is changed to the point of time that the level of the reference clock is changed. Due to such a constitution, it is possible to have an advantageous effect that the time difference signal can be easily obtained.

According to the ninth aspect of the present invention, in the resonant pressure sensor type differential pressure/pressure transmitter according to any one of the sixth to eighth aspects of the present invention, the time expansion circuit includes the first time constant circuit which is charged with a given voltage, the second time constant circuit which has the time constant larger than the time constant of the first time constant circuit and is charged with a given voltage, a comparator which compares output voltages of the first and second time constant circuits, and the gate circuit to which an output of the comparator and the signal relevant to the start signal are inputted and which outputs the signal relevant to the output of the comparator during the pulse width of the signal relevant to the start signal, wherein the charge stored in the first time constant circuit during the output pulse width of the time difference detection circuit is discharged, and the charge stored in the second time constant circuit during the pulse width of the start signal is discharged.

Due to such a constitution, it is possible to achieve an advantageous effect that the pulse width can be expanded with the simple circuit. Further, it is also possible to achieve an advantageous effect that the expansion ratio can be changed by merely changing values of the capacitor and the resistance.

According to the tenth aspect of the present invention, in the resonant pressure sensor type differential pressure/pressure transmitter according to any one of the sixth to eighth aspects of the present invention, the time expansion circuit includes the first voltage dividing circuit and the second voltage dividing circuit which are arranged between the fixed power source voltage and the common potential point, the operational amplifier which connects the voltage dividing point of the first voltage dividing circuit with the inverted input terminal and connects the voltage dividing point of the second voltage dividing circuit to the non-inverted input terminal as the fixed threshold voltage thus forming the integrator, and the comparator which connects the output of the operational amplifier with the inverted input terminal and connects the voltage dividing point of the second voltage dividing circuit to the non-inverted input terminal as the fixed threshold voltage, wherein the charge stored in the capacitor in the inside of the integrator is discharged in response to inputting of the time difference signal.

Due to such a constitution, it is possible to achieve an advantageous effect that the pulse width can be expanded with the simple circuit. Further, it is also possible to achieve an advantageous effect that the expansion ratio can be changed by merely changing value of the resistance.

What is claimed is:

1. A frequency measuring circuit comprising:
a first counter which counts reference clocks during one cycle of a signal to be measured or a period which is integer times as long as the one cycle, a time difference detection circuit which detects time difference between the signal to be measured and the reference clock, a time expansion circuit which expands an output pulse width of the time difference detection circuit by a given magnification, and a second counter which counts the reference clocks during the pulse width which is expanded by the time expansion circuit, wherein
the frequency of the signal to be measured is obtained based on count values of the first and second counters.

2. A frequency measuring circuit according to claim 1, wherein the count value of the second counter is divided by the given magnification with which the time expansion circuit expands the pulse width, and a result of the division is added to the count value of the first counter so as to obtain the frequency of the signal to be measured.

3. A frequency measuring circuit according to claim 1 or claim 2, wherein the time difference detection circuit outputs a pulse signal having the pulse width from a point of time that a level of the signal to be measured is changed to a point of time that a level of the reference clock is changed.

4. A frequency measuring circuit according to claim 1 or claim 2, wherein the time expansion circuit includes a first time constant circuit which is charged with a given voltage, a second time constant circuit which has a time constant larger than a time constant of the first time constant circuit and is charged with a given voltage, a comparator which compares output voltages of the first and second time constant circuits, and a gate circuit to which an output of the comparator and a signal relevant to a start signal are inputted and which outputs a signal relevant to an output of the comparator during a pulse width of the signal relevant to the start signal, wherein a charge stored in the first time constant circuit during the output pulse width of the time difference detection circuit is discharged, and a charge stored in the second time constant circuit during the pulse width of the start signal is discharged.

5. A frequency measuring circuit according to claim 1 or claim 2, wherein the time expansion circuit includes a first voltage dividing circuit and a second voltage dividing circuit which are arranged between a fixed power source voltage and a common potential point, an operational amplifier which connects a voltage dividing point of the first voltage dividing circuit with an inverted input terminal and connects a voltage dividing point of the second voltage dividing circuit to a non-inverted input terminal as a fixed threshold voltage thus forming an integrator, and a comparator which connects an output of the operational amplifier with an inverted input terminal and connects a voltage dividing point of the second voltage dividing circuit to a non-inverted input terminal as a fixed threshold voltage, wherein a charge stored in a capacitor in the inside of the integrator is discharged in response to inputting of the time difference signal.

6. A frequency measuring circuit according to claim 1 or claim 2, wherein the time expansion circuit includes a first buffer which receives a start signal, a first diode connected to an output terminal of the first buffer, a second buffer which receives an output from the time difference detection circuit, a second diode connected to an output terminal of the second buffer, a first time constant circuit which is charged with a given voltage, a second time constant circuit which has a time constant larger than a time constant of the first time constant circuit and is charged with a given voltage, a comparator which compares output voltages of the first and second time constant circuits, a first switch having one end connected to a reference voltage and another end connected to an inverted input terminal of the comparator, a second switch having one end connected to the reference voltage and another end connected to an non-inverted input terminal of the comparator, and a gate circuit to which an output of the comparator and a signal relevant to the start signal are inputted and which outputs a signal relevant to an output of the comparator during a pulse width of the signal relevant to the start signal, wherein a charge stored in the first time constant circuit during the output pulse width of the time difference detection circuit is discharged, and a charge stored in the second time constant circuit during the pulse width of the start signal is discharged.

7. A frequency measuring circuit according to claim 1 or claim 2, wherein the time expansion circuit includes a first voltage dividing circuit and a second voltage dividing circuit which are arranged between a fixed power source voltage and a common potential point, an operational amplifier which connects a voltage dividing point of the first voltage dividing circuit with an inverted input terminal and connects a voltage dividing point of the second voltage dividing circuit to a non-inverted input terminal as a fixed threshold voltage thus forming an integrator, a comparator which connects an output of the operational amplifier with an inverted input terminal and connects a voltage dividing point of the second voltage dividing circuit to a non-inverted input terminal as a fixed threshold voltage, a capacitor connected between the inverted input terminal and the output terminal of the operational amplifier, and a series circuit including first and second fixed voltage diodes connected in parallel with the capacitor, wherein a charge stored in a capacitor in the inside of the integrator is discharged in response to inputting of the time difference signal.

8. A resonant pressure sensor type differential pressure/pressure transmitter comprising:

a first counter which counts reference clocks during one cycle of a resonant pressure sensor or a period which is integer times as long as the one cycle, a time difference detection circuit which detects time difference between the signal to be measured and the reference clock, a time expansion circuit which expands an output pulse width of the time difference detection circuit by a given magnification, and a second counter which counts the reference clocks during the pulse width which is expanded by the time difference expansion circuit, wherein the frequency of the signal to be measured is obtained based on count values of the first and second counters, and pressure is obtained based on the frequency.

9. A resonant pressure sensor type differential pressure/pressure transmitter according to claim 8, wherein the count value of the second counter is divided by the given magnification with which the time expansion circuit expands the pulse width, and a result of the division is added to the count value of the first counter so as to obtain the frequency of the signal to be measured.

10. A resonant pressure sensor type differential pressure/pressure transmitter according to claim 8 or claim 9, wherein the time difference detection circuit outputs a pulse signal having the pulse width from a point of time that a level of the signal to be measured is changed to a point of time that a level of the reference clock is changed.

11. A resonant pressure sensor type differential pressure/pressure transmitter according to claim 8 or claim 9, wherein the time expansion circuit includes a first time constant circuit which is charged with a given voltage, a second time constant circuit which has a time constant larger than a time constant of the first time constant circuit and is charged with a given voltage, a comparator which compares output voltages of the first and second time constant circuits, and a gate circuit to which an output of the comparator and a signal relevant to a start signal are inputted and which outputs a signal relevant to an output of the comparator during a pulse width of the signal relevant to the start signal, wherein a charge stored in the first time constant circuit during the output pulse width of the time difference detection circuit is discharged, and a charge stored in the second time constant circuit during the pulse width of the start signal is discharged.

12. A resonant pressure sensor type differential pressure/pressure transmitter according to claim 8 or claim 9, wherein the time expansion circuit includes a first voltage dividing circuit and a second voltage dividing circuit which are arranged between a fixed power source voltage and a common potential point, an operational amplifier which connects a voltage dividing point of the first voltage dividing circuit with an inverted input terminal and connects a voltage dividing point of the second voltage dividing circuit to a non-inverted input terminal as a fixed threshold voltage thus forming an integrator, and a comparator which connects an output of the operational amplifier with an inverted input terminal and connects a voltage dividing point of the second voltage dividing circuit to a non-inverted input terminal as a fixed threshold voltage, wherein a charge stored in a capacitor in the inside of the integrator is discharged in response to inputting of the time difference signal.

13. A resonant pressure sensor type differential pressure/pressure transmitter according to claim 8 or claim 9, wherein the time expansion circuit includes a first buffer which receives a start signal, a first diode connected to an output terminal of the first buffer, a second buffer which receives an output from the time difference detection circuit, a second diode connected to an output terminal of the second buffer, a first time constant circuit which is charged with a given voltage, a second time constant circuit which has a time constant larger than a time constant of the first time constant circuit and is charged with a given voltage, a comparator which compares output voltages of the first and second time constant circuits, a first switch having one end connected to a reference voltage and another end connected to an inverted input terminal of the comparator, a second switch having one end connected to the reference voltage and another end connected to an non-inverted input terminal of the comparator, and a gate circuit to which an output of the comparator and a signal relevant to the start signal are inputted and which outputs a signal relevant to an output of the comparator during a pulse width of the signal relevant to the start signal, wherein a charge stored in the first time constant circuit during the output pulse width of the time difference detection circuit is discharged, and a charge stored in the second time constant circuit during the pulse width of the start signal is discharged.

14. A resonant pressure sensor type differential pressure/pressure transmitter according to claim 8 or claim 9, wherein the time expansion circuit includes a first voltage dividing circuit and a second voltage dividing circuit which are arranged between a fixed power source voltage and a common potential point, an operational amplifier which connects a voltage dividing point of the first voltage dividing circuit with an inverted input terminal and connects a voltage dividing point of the second voltage dividing circuit to a non-inverted input terminal as a fixed threshold voltage thus forming an integrator, a comparator which connects an output of the operational amplifier with an inverted input terminal and connects a voltage dividing point of the second voltage dividing circuit to a non-inverted input terminal as a fixed threshold voltage, a capacitor connected between the inverted input terminal and the output terminal of the operational amplifier, and a series circuit including first and second fixed voltage diodes connected in parallel with the capacitor, wherein a charge stored in a capacitor in the inside of the integrator is discharged in response to inputting of the time difference signal.

* * * * *